United States Patent
Ock et al.

(10) Patent No.: US 11,415,953 B2
(45) Date of Patent: Aug. 16, 2022

(54) APPARATUS AND METHOD FOR SELECTING GROUND CAPACITOR

(71) Applicant: LG Chem, Ltd., Seoul (KR)

(72) Inventors: Jang-Soo Ock, Daejeon (KR); Young-Ho Kim, Daejeon (KR)

(73) Assignee: LG Energy Solution, Ltd.

( * ) Notice: Subject to any disclaimer, the term of this patent is extended or adjusted under 35 U.S.C. 154(b) by 901 days.

(21) Appl. No.: 16/313,973

(22) PCT Filed: Jan. 24, 2018

(86) PCT No.: PCT/KR2018/001081
§ 371 (c)(1),
(2) Date: Dec. 28, 2018

(87) PCT Pub. No.: WO2018/143604
PCT Pub. Date: Aug. 9, 2018

(65) Prior Publication Data
US 2019/0258213 A1 Aug. 22, 2019

(30) Foreign Application Priority Data
Feb. 2, 2017 (KR) .......................... 10-2017-0015072

(51) Int. Cl.
*G05B 19/042* (2006.01)
*H01M 10/42* (2006.01)
(Continued)

(52) U.S. Cl.
CPC ............ *G05B 19/042* (2013.01); *B60L 58/10* (2019.02); *G01R 27/20* (2013.01); *H01M 10/425* (2013.01);
(Continued)

(58) Field of Classification Search
CPC ........ G05B 19/042; G05B 2219/24141; B60L 58/10; B60L 50/60; B60L 2270/147;
(Continued)

(56) References Cited

U.S. PATENT DOCUMENTS

2009/0112558 A1   4/2009   Garofano et al.
2009/0130541 A1   5/2009   Emori et al.
(Continued)

FOREIGN PATENT DOCUMENTS

CN   101399456 A   4/2009
CN   101743483 A   6/2010
(Continued)

OTHER PUBLICATIONS

International Search Report for PCT/KR2018/001081 (in English), dated May 11, 2018, 2 pages.
(Continued)

*Primary Examiner* — Robert L Deberadinis
(74) *Attorney, Agent, or Firm* — Lerner, David, Littenberg, Krumholz & Mentlik, LLP

(57) ABSTRACT

An apparatus and method for selecting a ground capacitor that is connected between a ground of a circuit board included in a battery pack and a vehicle chassis. The apparatus includes a checking module configured to check a ground location on the circuit board; a selecting module configured to select a reference location on the circuit board, based on the ground location checked by the checking module; a calculating module configured to calculate a distance from the reference location selected by the selecting module to a nearest ground location as a reference distance; a computing module configured to compute a reference frequency by using the reference distance calculated by the calculating module; and a choosing module configured to
(Continued)

choose a recommended capacitor, based on the reference frequency computed by the computing module.

20 Claims, 5 Drawing Sheets

(51) Int. Cl.
*H05K 1/02* (2006.01)
*H05K 3/00* (2006.01)
*G01R 27/20* (2006.01)
*B60L 58/10* (2019.01)
*B60L 50/60* (2019.01)
*B60K 6/28* (2007.10)
*B60R 16/033* (2006.01)

(52) U.S. Cl.
CPC ......... *H05K 1/0215* (2013.01); *H05K 3/0005* (2013.01); *B60K 6/28* (2013.01); *B60L 50/60* (2019.02); *B60L 2270/147* (2013.01); *B60R 16/033* (2013.01); *B60Y 2200/91* (2013.01); *B60Y 2200/92* (2013.01); *G05B 2219/24141* (2013.01); *H01M 2010/4271* (2013.01); *H01M 2220/20* (2013.01); *H05K 2201/10015* (2013.01); *H05K 2201/10409* (2013.01); *Y02T 10/62* (2013.01)

(58) Field of Classification Search
CPC .... G01R 27/20; H01M 10/42; H01M 10/425; H01M 2010/4271; H01M 2220/20; H05K 1/02; B60K 6/28; B60R 16/033; B60Y 2200/91; B60Y 2200/92; Y02T 10/62
See application file for complete search history.

(56) References Cited

U.S. PATENT DOCUMENTS

| | | |
|---|---|---|
| 2010/0301881 A1 | 12/2010 | Dunn et al. |
| 2011/0094075 A1 | 4/2011 | Lee et al. |
| 2013/0264875 A1 | 10/2013 | Kaminsky et al. |
| 2014/0071644 A1 | 3/2014 | Yoon et al. |
| 2015/0263694 A1 | 9/2015 | Sun |
| 2015/0347668 A1 | 12/2015 | Nojima et al. |
| 2016/0172111 A1 | 6/2016 | Jun et al. |
| 2017/0062879 A1 | 3/2017 | Roh et al. |

FOREIGN PATENT DOCUMENTS

| | | |
|---|---|---|
| CN | 102044959 A | 5/2011 |
| CN | 202661551 U | 1/2013 |
| CN | 104285336 A | 1/2015 |
| CN | 104936375 A | 9/2015 |
| CN | 106294996 A | 1/2017 |
| JP | H1097560 A | 4/1998 |
| JP | 2001203434 A | 7/2001 |
| JP | 2013108924 A | 6/2013 |
| JP | 2013238954 A | 11/2013 |
| JP | 2015-106536 A | 6/2015 |
| JP | 2016161354 A | 9/2016 |
| KR | 101027965 B1 | 4/2011 |
| KR | 101070287 B1 | 10/2011 |
| KR | 2012-0138978 A | 12/2012 |
| KR | 2014-0034494 A | 3/2014 |
| KR | 101543039 B1 | 8/2015 |
| KR | 2015-0108135 A | 9/2015 |
| KR | 2015-0124622 A | 11/2015 |
| KR | 2015-0128604 A | 11/2015 |

OTHER PUBLICATIONS

Chinese Search Report for Application No. 201880002931.1 dated May 8, 2021, pp. 1-4.

Rius, J. "Supply Noise and Impedance of On-Chip Power Distribution Networks in ICs With Nonuniform Power Consumption and Interblock Decoupling Capacitors", IEEE Transactions on Very Large Scale Integration (VLSI) Systems, accepted Jun. 2014, pp. 1-12.

Zeng, C. "Study on Impacts of MOV Nonlinear Characteristic on Protection and Countermeasures" North China Electric Power University, Mar. 2015, 67 pages (Providing English Translation of Abstract only p. 6-7).

Extended European Search Report including the Written Opinion for Application No. 18748301.1 dated Oct. 4, 2019, 7 pages.

| MODEL NAME | CAPACITANCE | ESL | ESR | Fres |
|---|---|---|---|---|
| C1 | 8nF | 816 pH | 53.6 mΩ | 56.0 MHz |
| C2 | 9nF | 536 pH | 24.8 mΩ | 68.1 MHz |
| C3 | 10nF | 529 pH | 24.9 mΩ | 72.3 MHz |
| C4 | 10nF | 653 pH | 21.9 mΩ | 68.1 MHz |
| C5 | 10nF | 781 pH | 22.8 mΩ | 78.5 MHz |
| C6 | 11nF | 627 pH | 24 mΩ | 82.3 MHz |

APPARATUS AND METHOD FOR SELECTING GROUND CAPACITOR

CROSS-REFERENCE TO RELATED APPLICATIONS

The present application is a national phase entry under 35 U.S.C. § 371 of International Application No. PCT/KR2018/001081 filed Jan. 24, 2018, published in Korean, which claims priority from Korean Patent Application No. 10-2017-0015072 filed on Feb. 2, 2017 in the Republic of Korea, all of which are incorporated herein by reference.

TECHNICAL FIELD

The present disclosure relates to a technique for selecting a capacitor, and more particularly, to an apparatus and method for selecting an optimal capacitor that is capable of minimizing ground impedance at a circuit board including a BMS of a battery pack for a vehicle.

BACKGROUND ART

In recent years, the demand for portable electronic products such as notebook computers, video cameras and portable phones has increased sharply, and the electric vehicles, energy storage batteries, robots and satellites has been active developed. Accordingly, high-performance secondary batteries allowing repeated charging and discharging are being actively studied.

Secondary batteries commercially available at the present include nickel-cadmium batteries, nickel-hydrogen batteries, nickel-zinc batteries, lithium secondary batteries and the like. Among them, the lithium secondary batteries have almost no memory effect compared to nickel-based secondary batteries and thus are in the limelight due to advantageous of free charging and discharging, low self-discharge rate and high energy density.

Recently, secondary batteries are widely used not only in small-sized devices such as portable electronic devices but also in medium-sized and large-sized devices such as vehicles and power storage devices. In particular, as carbon energy is getting depleted and the interest in the environment increases, the attention is focused on hybrid electric vehicles and electric vehicles around the world including US, Europe, Japan and Korea. The most important component of the hybrid electric vehicle or the electric vehicle is a battery pack that applies a drive power to a vehicle motor. Since the hybrid electric vehicle or the electric vehicle obtains a driving force of a vehicle through charging and discharging of the battery pack, it has higher fuel efficiency than that of a vehicle using only an engine and also emits less or substantially no pollutants. For these reasons, the hybrid electric vehicle or the electric vehicle is used more and more. In addition, the battery pack of the hybrid electric vehicle or the electric vehicle includes a plurality of secondary batteries, which are connected in series and in parallel to improve capacity and output.

The battery pack may include several electrical components together with the plurality of secondary batteries. In particular, the battery pack may include a battery management system (BMS) that manages the charging/discharging operation of the battery pack as a whole. Also, the BMS may be mounted on a single circuit board such as a printed circuit board (PCB) and provided in the battery pack.

The circuit board equipped with a BMS is an electrical component, and noise may be generated in the BMS. The noise may cause malfunction of the BMS or the like in the circuit board or malfunction of an electronic control unit (ECU) of the vehicle connected to the battery pack. Thus, noise generated from the circuit board equipped with a BMS or the like needs to be appropriately discharged to the outside.

In order to discharge noise of the BMS or the like to the outside, a capacitor (a ground capacitor) may be connected between a ground of the circuit board equipped with a BMS and a chassis used as a ground in a vehicle. However, at this time, the type of the capacitor needs to be appropriately selected, and if not, the noise reduction effect is inevitably deteriorated. In particular, when the ground of the BMS is connected to the chassis ground for noise emission, it is necessary to minimize ground impedance. It is possible that a work for finding a suitable capacitor is repeated while exchanging many capacitors. However, in this case, it is impossible to efficiently select a capacitor in terms of time, cost and effort.

DISCLOSURE

Technical Problem

The present disclosure is designed to solve the problems of battery pack for a vehicle, which may efficiently select an optimal capacitor when a ground of a circuit board and a vehicle chassis are connected to a capacitor in order to discharge noise generated from the circuit board of a battery pack for a vehicle, or a BMS mounted thereto to the outside.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for selecting a ground capacitor that is connected between a ground of a circuit board included in a battery pack and a vehicle chassis, the apparatus comprising: a checking module configured to check one or more ground locations on the circuit board; a selecting module configured to select a reference location on the circuit board, based on the one or more ground locations checked by the checking module; a calculating module configured to calculate a distance from the reference location selected by the selecting module to a nearest ground location as a reference distance; a computing module configured to compute a reference frequency by using the reference distance calculated by the calculating module; and a choosing module configured to choose a recommended capacitor, based on the reference frequency computed by the computing module.

Here, the circuit board may be coupled to the vehicle chassis by a bolt, and the ground capacitor may have one end connected to the bolt and the other end connected to the ground of the circuit board.

In addition, the checking module may check locations of a connector terminal and the ground capacitor provided at the circuit board, as the one or more ground locations.

In addition, the selecting module may form a circle around each of the one or more ground locations with the same radius and selects at least a part of a region positioned out of the formed circles and existing on the circuit board as the reference location.

In addition, the selecting module may calculate a distance from a center point of two ground locations to each ground location, selects a minimum distance that is shortest among the calculated distances, identify a ground location pair where the selected minimum distance is longest, and set a distance from a center point of the identified ground location pair to the identified ground location pair as the radius.

In addition, the selecting module may select the reference location as a region, and the calculating module may calculate a distance from a center point of the region to a nearest ground location as the reference distance.

In addition, the computing module may compute a wavelength at the circuit board and a wavelength in air in order by using the reference distance and compute the reference frequency according to the computed wavelength in air.

In addition, the choosing module may choose a capacitor having a resonance frequency equal to or lower than the reference frequency as the recommended capacitor.

In addition, the choosing module may choose a capacitor having a lowest parasitic resistance among capacitors having a resonance frequency equal to or lower than the reference frequency as the recommended capacitor.

In addition, the checking module may include an input unit for receiving the one or more ground locations from a user.

In addition, the checking module may check the one or more ground locations from a photo image obtained by photographing the circuit board.

In addition, the apparatus for selecting a ground capacitor according to the present disclosure may further comprise a storing module configured to store resonance frequency information about various kinds of capacitors.

In another aspect of the present disclosure, there is also provide a method for selecting a ground capacitor that is connected between a ground of a circuit board included in a battery pack and a vehicle chassis, the method comprising: a checking step for checking one or more ground locations on the circuit board; a selecting step for selecting a reference location on the circuit board, based on the one or more ground locations checked in the checking step; a calculating step for calculating a distance from the reference location selected in the selecting step to a nearest ground location as a reference distance; a computing step for computing a reference frequency by using the reference distance calculated in the calculating step; and a choosing step for choosing a recommended capacitor, based on the reference frequency computed in the computing step.

In addition, the checking step may check locations of a connector terminal and the ground capacitor provided at the circuit board, as the one or more ground locations.

In addition, the selecting step may form a circle around each of the one or more ground locations with the same radius and select at least a part of a region positioned out of the formed circles and existing on the circuit board as the reference location.

In addition, the method may further involve calculating a distance from a center point of two ground locations to each ground location, selecting a minimum distance that is shortest among the calculated distances, identifying a ground location pair where the selected minimum distance is longest, and setting a distance from a center point of the identified ground location pair to the identified ground location pair as the radius.

In addition, the selecting step may select the reference location as a region, and the calculating step may calculate a distance from a center point of the region to a nearest ground location as the reference distance.

In addition, the computing step may compute a wavelength at the circuit board and a wavelength in air in order by using the reference distance, and may compute the reference frequency according to the computed wavelength in air.

In addition, the choosing step may choose a capacitor having a lowest parasitic resistance among capacitors having a resonance frequency equal to or lower than the reference frequency as the recommended capacitor.

In addition, the one or more ground locations may be received from at least one of an input unit for receiving the one or more ground locations from a user, or a photo image obtained by photographing the circuit board.

Advantageous Effects

According to an embodiment of the present disclosure, even though noise is generated in a circuit board equipped with a BMS, it is possible to effectively discharge the noise to the outside.

In particular, according to an embodiment of the present disclosure, a suitable capacitor may be selected to be connected between a ground of the circuit board equipped with a BMS and a chassis used as a ground in a vehicle.

Further, according to the present disclosure, the ground impedance is minimized between the ground of the BMS and the chassis ground, and thus the noise removing performance may be excellent.

Moreover, since the process of selecting a capacitor may be performed automatically, without repeatedly replacing the capacitor, it is possible to greatly reduce time, cost effort and prevent trial and error, thereby ensuring efficient capacitor selection.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The present disclosure is directed to an apparatus for selecting a ground capacitor. In particular, the grounding capacitor to which the present disclosure is applied is a capacitor provided at a circuit board of a battery pack for a vehicle, which may be a capacitor for grounding, connected to a vehicle chassis.

Figure 1:
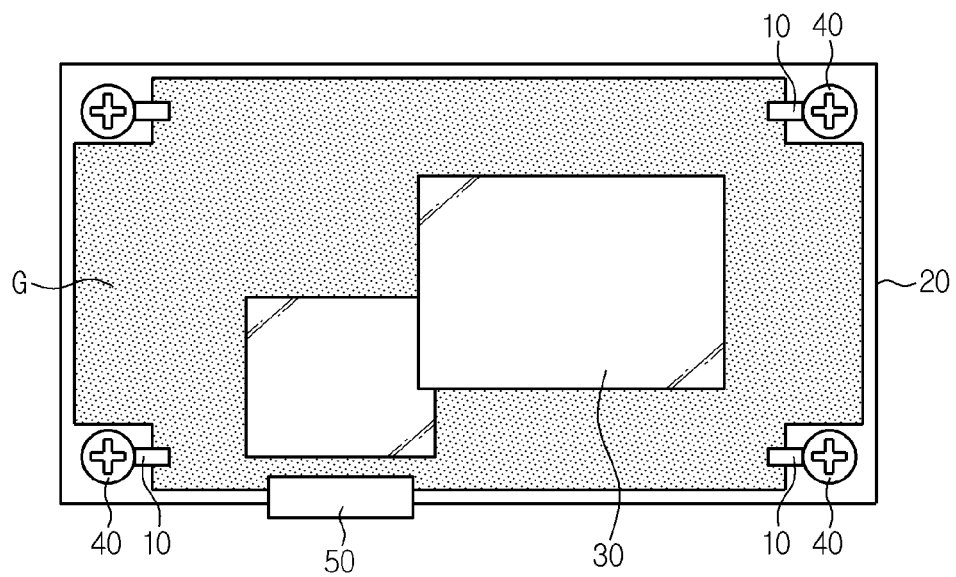
FIG. 1 is a diagram schematically showing an example where a ground capacitor to which the present disclosure is applicable is provided at a circuit board, observed from the above.

FIG. 1 is a diagram schematically showing an example where a ground capacitor 10 to which the present disclosure is applicable is provided at a circuit board 20, observed from the above.

Referring to FIG. 1, a battery management system (BMS) 30 may be mounted to an upper portion of a circuit board 20. Here, the BMS 30 means a battery management device that controls the charging/discharging operation of a battery pack as a whole, and the BMS 30 may be generally included in the battery pack.

The circuit board 20 is configured to mount the BMS 30 thereto and may be a printed circuit board (PCB). Thus, various wirings may be printed at the circuit board 20 as current paths. In addition, the circuit board 20 may have a ground. The ground of the circuit board 20 is depicted broadly and indicated by G in FIG. 1.

In addition, the circuit board 20 may include a connector terminal 50. The connector terminal 50 may give a terminal for connecting the circuit board to another external device, for example a battery module including a plurality of secondary batteries or an ECU of a vehicle. Moreover, the connector terminal 50 may be connected to the BMS 30 of the circuit board 20.

In particular, the circuit board 20 may include a ground capacitor 10 for grounding. The ground capacitor 10 may be connected between the ground of the circuit board 20 equipped with the BMS 30 and the vehicle chassis. The connection structure of the circuit board 20 and the chassis is schematically shown in FIG. 2 as an example.

Figure 2:
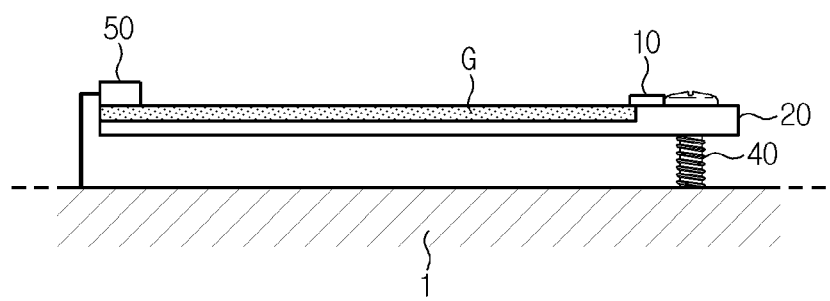
FIG. 2 is a side view schematically showing an example where a ground capacitor is connected between a ground of the circuit board and a vehicle chassis.

In other words, FIG. 2 is a side view schematically showing an example where the ground capacitor 10 is connected between a ground of the circuit board 20 and a vehicle chassis 1. In FIG. 2, for convenience of explanation, only one coupling member and one ground capacitor 10 are depicted, and other components such as other ground capacitors, coupling members and BMS are not depicted.

Referring to FIG. 2, the circuit board 20 may be coupled to a chassis 1 by a bolt 40. For example, as shown in FIG. 1, the circuit board 20 may have a substantially rectangular shape as viewed from the above, and the bolt 40 may be respectively provided to four corners to be coupled to the chassis 1. Here, if the circuit board 20 is provided at a battery pack for a vehicle, the chassis 1 may be a vehicle chassis. At this time, the vehicle chassis may act as a ground for various electric devices mounted to the vehicle.

The ground G of the circuit board 20 may be connected to the chassis 1 by means of the bolt 40 which couples the circuit board 20 and the chassis 1 to each other. At this time, the ground capacitor 10 may be provided between the ground G of the circuit board 20 and the bolt 40. In particular, one end of the ground capacitor 10 may be directly connected to the bolt 40, and the other end of the ground capacitor 10 may be directly connected to the ground G of the circuit board 20.

In addition, the connector terminal 50 provided at the circuit board 20 may include a ground pin as a ground terminal. In addition, the ground pin may be connected to the vehicle chassis 1 via an AUX line or the like. Thus, the ground G of the circuit board 20 and the chassis 1 may be connected to the chassis 1 not only through the bolt 40 but also through the connector terminal 50.

The apparatus for selecting a ground capacitor according to the present disclosure may select a suitable ground capacitor in the configuration as shown in FIGS. 1 and 2.

Figure 3:
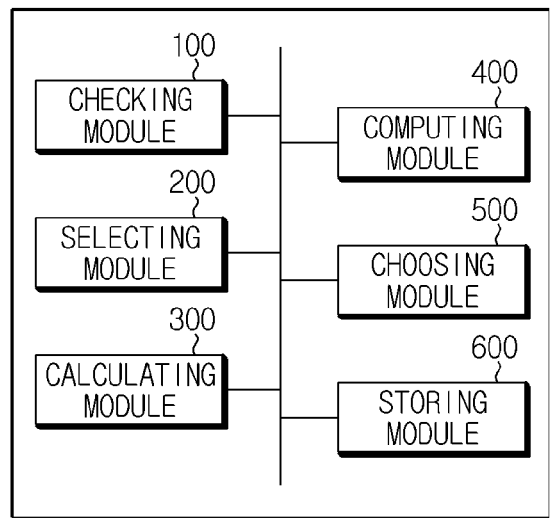
FIG. 3 is a block diagram schematically showing an apparatus for selecting a ground capacitor according to an embodiment of the present disclosure.

FIG. 3 is a block diagram schematically showing an apparatus for selecting a ground capacitor according to an embodiment of the present disclosure.

Referring to FIG. 3, the apparatus for selecting a ground capacitor according to the present disclosure may include a checking module 100, a selecting module 200, a calculating module 300, a computing module 400 and a choosing module 500.

The checking module 100 may check a ground location on the circuit board. In particular, the checking module 100 may check locations of the connector terminal and the ground capacitor provided at the circuit board as the ground location.

Figure 4:
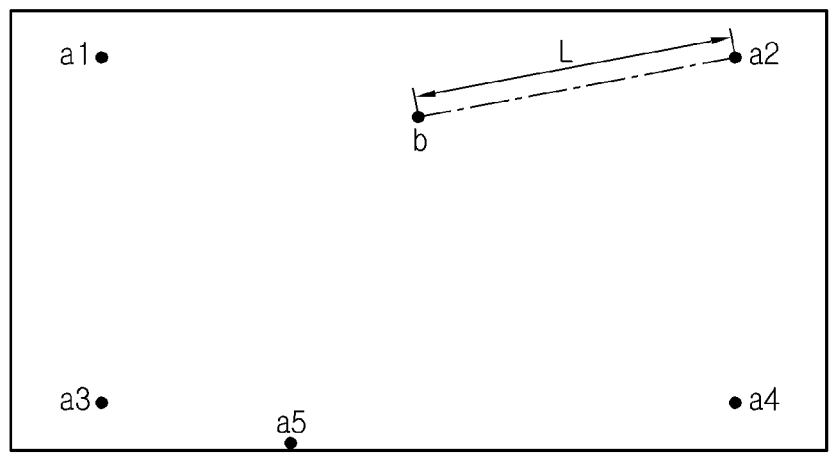
FIG. 4 is a diagram showing an example where a ground location is checked by a checking module according to an embodiment of the present disclosure.

FIG. 4 is a diagram showing an example where a ground location is checked by a checking module according to an embodiment of the present disclosure.

Referring to FIG. 4, the ground location checked by the checking module 100 is represented by five points a1 to a5 on a rectangle. In particular, the rectangle of FIG. 4 may be regarded as representing the configuration of the circuit board of FIG. 1. In addition, the points a1 to a5 marked in FIG. 4 may be regarded as indicating the ground locations. Further, four points a1 to a4 may be regarded as corresponding to the locations of four ground capacitors located at the corners of the circuit board of FIG. 1, and the point a5 may be regarded as corresponding to the location of the connector terminal at the circuit board of FIG. 1.

If the ground location is checked on the circuit board by the checking module 100, the checked ground location information may be provided to the selecting module 200.

The selecting module 200 may select a reference location on the circuit board, based on the ground location checked by the checking module 100.

For example, in FIG. 4, the selecting module 200 may select a point b as the reference location in consideration of locations of five points a1 to a5.

Moreover, the selecting module 200 may select, as the reference location, a point on the circuit board that is distant from each ground location a1 to a5 checked by the checking module 100 as uniformly as possible. That is, the selecting module 200 may select the reference location such that the reference location is not excessively close to any one of several ground locations a1 to a5.

In particular, the selecting module 200 may select, as the reference location, a point among the various points on the circuit board, where the shortest distance among the distances from all the ground locations a1 to a5 can be longest. According to this configuration of the present disclosure, when noise is generated by BMS or the like at the circuit board, the noise is not concentrated to a specific ground location, thereby further reducing the ground impedance.

Thus, if the reference location is selected by the selecting module 200, the selected reference location information may be transmitted to the calculating module 300.

The calculating module 300 may calculate a distance from the reference location selected by the selecting module 200 to a nearest ground location as a reference distance.

For example, in FIG. 4, the calculating module 300 may figure out which ground location among the five ground locations a1 to a5 is closest to the point b selected as the reference location. If the calculating module 300 determines that the point a2 is the ground point closest to the point b, the calculating module 300 may calculate a distance between the point a2 and the point b and define it as a reference distance L.

If the reference distance is calculated by the calculating module 300, the calculated reference distance information may be transmitted to the computing module 400.

The computing module 400 may compute a reference frequency using the reference distance calculated by the calculating module 300.

In particular, first, the computing module 400 may compute a wavelength at the circuit board using the reference distance.

For example, the computing module 400 may compute a wavelength range at the circuit board by Equation 1 below.

$$\lambda_e = aL \qquad \text{Equation 1}$$

Here, $\lambda_e$ is a wavelength in the circuit board, a is a constant, and L is a reference distance.

In Equation 1, a may be a value that is set so that the effect of noise due to the impedance difference between all the points of the circuit board and the chassis (the ground) is not generated or minimized.

For example, in Equation 1, a may be 20. In this case, Equation 1 may be expressed like Equation 2 below.

$$\lambda_e = 20L \qquad \text{Equation 2}$$

Moreover, the computing module 400 may compute the wavelength in the form of a range. That is, the computing module 400 may compute the wavelength range at the circuit board by using the reference distance.

For example, the computing module 400 may compute the wavelength range at the circuit board by using the reference distance as follows.

$$\lambda_e \geq 20L$$

In this case, the computing module 400 may compute the wavelength range at the circuit board as 20L or above (here, L is a reference distance). At this time, it may be regarded that electrical lengths from all points of the circuit board to the chassis (the ground) are set to be $\lambda_e/20$ or below.

According to this configuration of the present disclosure, the ground impedance may be minimized at various points of the circuit board where noise may be generated. Further, in this case, the noise in the circuit board moves out to the ground out of the circuit board at a distance of $\lambda_e/20$ or below, thereby ensuring stable ground characteristics for the circuit board.

The computing module 400 may set a value other than 20 as the a value. For example, the computing module 400 may set a value such as 30 or 40 as the a value. If the a value is increased further as above, the ground impedance may be further reduced.

More specifically, assuming that a is 20 in Equation 1 and the reference distance is calculated as 0.1 m by the calculating module 300, the computing module 400 may compute the wavelength at the circuit board as follows by using Equation 2.

$$\lambda_e = 2m$$

That is, the computing module 400 can compute the wavelength at the circuit board as 2 m.

Further, the computing module 400 may represent the wavelength at the circuit board in a range form. Thus, in this case, the wavelength range at the circuit board is $\lambda_e \geq 2$ m, and the computing module 400 may derive a first intermediate result that the wavelength range at the circuit board should be 2 m or above.

If the wavelength at the circuit board is calculated using the reference distance as above, the computing module 400 may compute a wavelength in the air using the same.

For example, the computing module 400 may compute the wavelength in the air using Equation 3 as follows.

$$\lambda_e = \frac{\lambda}{\sqrt{\varepsilon_r}} \qquad \text{Equation 3}$$

Here, $\lambda$ is a wavelength in the air, $\lambda_e$ is a wavelength in the circuit board, and $\varepsilon_r$ is a dielectric constant of a dielectric substance in the circuit board.

By using Equation 3 together with Equation 2, $\lambda$ may be arranged as in Equation 4 below.

$$\lambda = 20L\sqrt{\varepsilon_r} \qquad \text{Equation 4}$$

L is a reference distance that can be calculated by the calculating module 300, and $\varepsilon_r$ is a dielectric constant of the circuit board and may be a known value. Thus, the computing module 400 may compute the wavelength ($\lambda$) in the air by using Equation 4.

Further, the computing module 400 may compute the wavelength ($\lambda$) in the air in a range form. That is, when the computing module 400 computes the wavelength at the circuit board in a range form, the wavelength in the air may also be calculated in a range form.

For example, the computing module 400 may represent the wavelength range in the air as follows by using the above equations.

$$\lambda \geq 20L\sqrt{\varepsilon_r}$$

Assuming that the reference distance L is calculated as 0.1 m as in the former embodiment and $\varepsilon_r$ is 4, the wavelength range in the air may be calculated as follows.

$$\lambda = 4m$$

That is, the computing module 400 may derive a secondary intermediate result that the wavelength in the air is 4 m. Alternatively, the computing module 400 may derive a result that the wavelength in the air should be 4 m or above.

If the wavelength in the air is calculated as above, the computing module 400 may compute a reference frequency according to the calculated wavelength.

In particular, the computing module 400 may compute the reference frequency by using Equation 5 below.

$$f = c/\lambda \qquad \text{Equation 5}$$

Here, f is the reference frequency, c is the speed of light, and λ is the wavelength in the air.

If the wavelength range in the air is calculated as 4 m or more as in the former embodiment, c is 3×10⁸ m/s, so the reference frequency f may be calculated as follows.

$$f = 75 \text{ MHz}$$

That is, the computing module 400 may compute the reference frequency as 75 MHz. Moreover, the computing module 400 may compute the reference frequency as a range form as follows by using the above equations.

$$f \leq c/(20L\sqrt{\varepsilon_r})$$

Here, f is the reference frequency, c is the speed of light, L is the reference distance, and $\varepsilon_r$ is a dielectric constant of a dielectric material in the circuit board.

If the reference frequency is computed by the computing module 400 as described above, the computed reference frequency information may be provided to the choosing module 500.

The choosing module 500 may choose a recommended capacitor, based on the reference frequency computed by the computing module 400.

That is, if the reference frequency is computed by the computing module 400, the choosing module 500 chooses one capacitor, in particular a capacitor that allows noise generated from the circuit board to be effectively emitted to the outside, among various kinds of capacitors, and provide the capacitor to the user.

In this case, it is desirable that the specification information of various kinds of capacitors are stored in advance in the apparatus for selecting a ground capacitor according to the present disclosure.

For this, the apparatus for selecting a ground capacitor according to the present disclosure may further include a storing module 600 as shown in FIG. 3.

The storing module 600 may store information about various kinds of capacitors in advance. In particular, the storing module 600 may further store resonance frequency information about various kinds of capacitors.

Figures 5, 6:
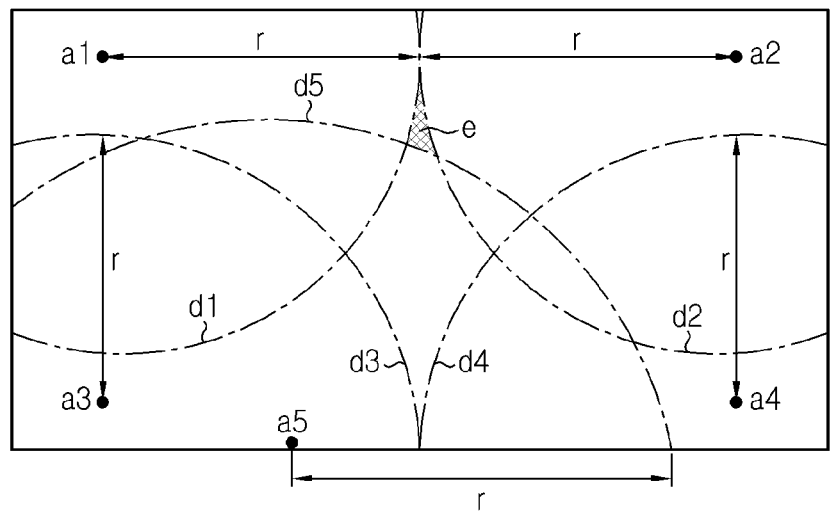
FIG. 5 is a table showing a part of capacitor information stored in a storing module according to an embodiment of the present disclosure.
FIG. 6 is a diagram showing an example where a reference location is selected by a selecting module according to an embodiment of the present disclosure.

FIG. 5 is a table showing a part of capacitor information stored in the storing module 600 according to an embodiment of the present disclosure.

Referring to FIG. 5, the storing module 600 may include specification information such as model name, capacitance, parasitic inductance (ESL), parasitic resistance (ESR) and resonance frequency (Fres) as information about each capacitor.

The choosing module 500 may access the storing module 600 and choose an appropriate kind of capacitor by means of the information stored in the storing module 600 as above.

In particular, the choosing module 500 may choose a capacitor having a resonance frequency equal to or lower than the reference frequency as a recommended capacitor.

For example, if the reference frequency computed by the computing module 400 is 75 MHz as in the former embodiment, the choosing module 500 may choose a capacitor having a resonance frequency smaller than 75 MHz as a recommended capacitor. Further, if many capacitors have a resonance frequency equal to or lower than the reference frequency among the capacitors whose information is stored in the storing module 600, the choosing module 500 may choose one of these capacitors and provide only the information about the capacitor to the user.

For example, if the reference frequency is 75 MHz, in FIG. 5, capacitors c1, c2, c3 and c4 have a resonance frequency lower than 75 MHz, and thus the choosing module 500 may choose one of these four capacitors and provide it to the user as a recommended capacitor.

Here, the choosing module 500 may choose a capacitor whose resonance frequency is closest to the reference frequency as a recommended capacitor, among the capacitors having a resonance frequency lower than the reference frequency.

For example, in FIG. 5, when the reference frequency is 75 MHz, capacitors c1, c2, c3 and c4 have a resonance frequency lower than 75 MHz, and among them, the capacitor c3 has a resonance frequency of 72.3 MHz which is closest to the reference frequency. Thus, the choosing module 500 may choose the capacitor c3 as a recommended capacitor.

As described above, by using a capacitor whose resonance frequency is close to the reference frequency, it is possible to increase a frequency band that maintains low ground impedance.

In addition, when there are a lot of capacitors having a resonance frequency equal to or lower than the reference frequency, the choosing module 500 may choose a recommended capacitor in consideration of a parasitic resistance (ESR). In particular, the choosing module 500 may choose a capacitor having a lowest parasitic resistance as a recommended capacitor, among the capacitors having a resonance frequency equal to or lower than the reference frequency.

For example, in FIG. 5, if capacitors c1, c2, c3, c4 are identified as having a resonance frequency lower than the reference frequency, the capacitor c4 may be chosen as a recommended capacitor because this capacitor has a lowest parasitic resistance.

According to this configuration of the present disclosure, the noise emission effect may be maximized by minimizing the ground impedance.

In particular, the choosing module 500 may be configured to consider the resonance frequency firstly and the parasitic resistance secondly in regard to the capacitors having a resonance frequency lower than the reference frequency.

For example, in the embodiment of FIG. 5, if the reference frequency is 75 MHz, the choosing module 500 may choose one capacitor c3 as a recommended capacitor since the capacitor c3 has a resonance frequency that is smaller than 75 MHz and closest to 75 MHz.

However, in the embodiment of FIG. 5, if the reference frequency is computed to be 70 MHz by the computing module 400, three capacitors c1, c2, c4 may have a resonance frequency smaller than 70 MHz. In this case, since two capacitors c2, c4 have a resonance frequency closest to the reference frequency, the choosing module 500 may choose a capacitor having a smaller parasitic resistance as a recommended capacitor therefrom. That is, in FIG. 5, since the capacitor c4 has a smaller parasitic resistance than the capacitor c2, the choosing module 500 may choose the capacitor c4 as a recommended capacitor.

Preferably, the selecting module 200 forms a circle having the same radius around each ground location and select at least a part of a region located outside the formed circles and existing on the circuit board as a reference location.

FIG. 6 is a diagram showing an example where a reference location is selected by the selecting module 200 according to an embodiment of the present disclosure.

Referring to FIG. 6, centered on each of the five points a1 to a5 representing the ground locations, circles with the same radius r are displayed on a rectangle representing the circuit board. That is, d1 is a circle centered on the ground location a1, d2 is a circle centered on the ground location a2, d3 is a circle centered on the ground location a3, d4 is a circle centered on the ground location a4, and d5 is a circle around the ground location a5.

If five circles d1 to d5 are drawn corresponding to five ground locations as above, the selecting module 200 may find a region on the circuit board that does not belong to any of the five circles. Seeing FIG. 6, a region that does not belong to the five circles d1 to d5 on the circuit board is a portion indicated by e. Accordingly, the selecting module 200 may find a region denoted by e in this way and select at least a part of the region denoted by e as a reference location.

Here, the reference location may be a single point or a predetermined region having a certain area. For example, in FIG. 6, the selecting module 200 may select the entire region indicated by e as the reference location. Alternatively, the selecting module 200 may select any one point in the region indicated by e as the reference location. For example, the reference location b depicted in FIG. 4 may be any point in the region denoted by e in FIG. 6.

According to this configuration of the present disclosure, a region located at approximately equal distance from each ground location without shifting to any one ground location may be easily found. That is, the process of selecting a point as far as possible from all the ground locations as a reference location may be easily performed.

In the configuration where a reference location is selected using a circle, the selecting module 200 may set the radius r of the circle by using a center point of two ground locations. More specifically, the selecting module 200 may calculate a distance from the center point of two ground locations to each ground location and select a minimum distance that is shortest among the calculated distances. After that, the selecting module 200 may identify a ground location pair that has a longest minimum distance among the selected minimum distances and set a distance from the center point of the identified ground location pair to the identified ground location pair as the radius r of the circle. This will be described in more detail with reference to FIG. 7.

Figure 7:
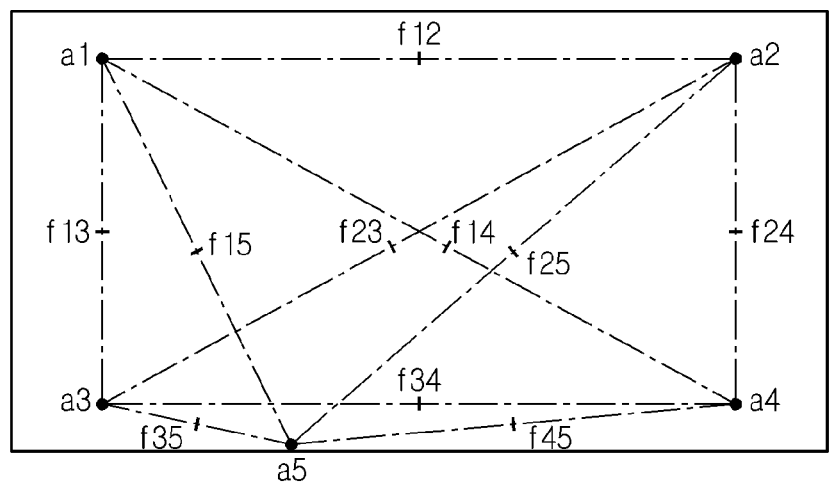
FIG. 7 is a diagram schematically showing a configuration for searching a center point between ground locations for selecting a reference location by the selecting module according to an embodiment of the present disclosure.

FIG. 7 is a diagram schematically showing a configuration for searching a center point between ground locations for selecting a reference location by the selecting module 200 according to an embodiment of the present disclosure.

Referring to FIG. 7, the selecting module 200 may firstly find a central portion between two ground locations, among the five ground locations. That is, the selecting module 200 may draw straight lines connecting from each of the five ground locations to the other ground locations and find a center point of each straight line. For example, the selecting module 200 may find a center point between the ground locations a1 and a2 to mark the center point with f12 and find a center point between the ground locations a1 and a3 to mark the center point as f13. Since ten center points may be found for the five ground locations in total, the selecting module 200 may find a center point for the remaining eight ground location pairs. That is, the selecting module 200 may mark center points of the distances from the ground location a1 to the ground locations a4 and a5 with f14, f15, respectively, and may mark center points of the distances from the ground location a2 to the ground locations a3, a4 and a5 with f23, f24, f25, respectively. In addition, the selecting module 200 may mark center points of the distances from the ground location a3 to the ground locations a4 and a5 with f34, f35, respectively, and may mark center points of the distances from the ground location a4 to the ground location a5 with f45. At this time, it is also possible that some center points overlap each other in some cases.

If the center point of each ground location pair is found as above, the selecting module 200 calculates a distance from each center point to every the ground location and select a shortest distance therefrom. This will be described in more detail with reference to FIG. 8.

Figure 8:
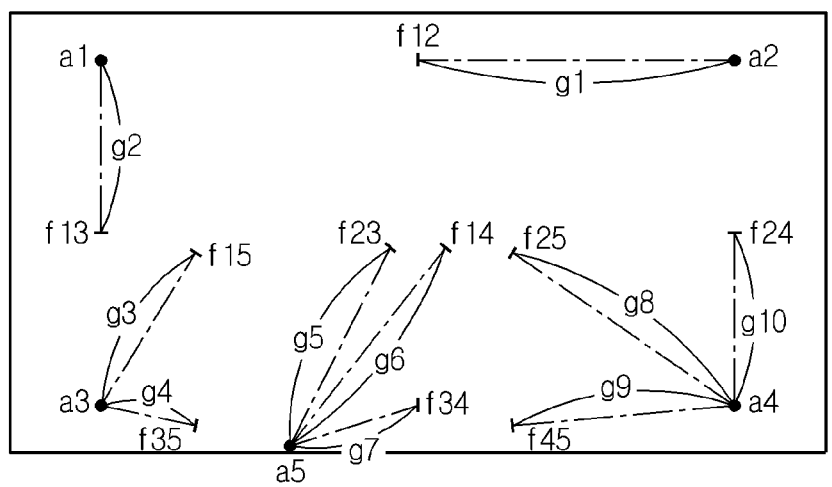
FIG. 8 is a diagram schematically showing a configuration for selecting a shortest distance among distances between the center point and other ground locations for selecting a reference location by the selecting module according to an embodiment of the present disclosure.

FIG. 8 is a diagram schematically showing a configuration for selecting a shortest distance among distances between the center point and other ground locations for selecting a reference location by the selecting module 200 according to an embodiment of the present disclosure.

Referring to FIG. 8, the selecting module 200 may calculate the distances from each of ten center points f12, f13, f14, f15, f23, f24, f25, f34, f35, f45 to the ground locations a1 to a5, respectively, and then select a shortest distance therefrom. In FIG. 8, straight lines connecting from each center point to any of five ground locations with a shortest distance as selected by the selecting module 200 are depicted.

For example, the selecting module 200 may calculate distances from the center point f12 to the ground locations a1 to a5, respectively, determine a distance g1 to the ground location a2 as a shortest distance among them, and select the distance g1 as a shortest distance to the center point f12. However, since the center point f12 is a center point of the ground locations a1 and a2, the distances from the center point f12 to the ground locations a1 to a2 are the same, and thus only the distance to the ground location a2 is depicted in FIG. 8. In addition, the selecting module 200 may calculate distances from the center point f13 to the ground locations a1 to a5, respectively, and select a distance g2 to the ground location a1 as a shortest distance among them. In addition, the selecting module 200 may calculate distances from the center point f15 to the ground locations a1 to a5, respectively, determine a distance g3 to the ground location a3 as a shortest distance among them, and select the distance g3 as a shortest distance to the center point f15.

The selecting module 200 may also select a shortest distance for all of the other seven center points f14, f23, f24, f25, f34, f35, f45 in this manner. In addition, for each center point, the selecting module 200 may select a shortest distance as the distance g6 for the center point f14, the distance g5 for the center point f23, the distance g10 for the center point f24, the distance g8 for the center point f25, the distance g7 for the center point f34, the distance g4 for the center point f35, and the distance g9 for the center point f45.

The selecting module 200 may determine a longest distance among the shortest distances g1 to g10 for each center point selected as above. For example, seeing FIG. 8, the selecting module 200 may compare the selected ten shortest distances g1 to g10 and determine the shortest distance g1 as a longest distance among them.

In this case, the selecting module 200 may set the determined shortest distance g1 as a radius of the circle. That is, the selecting module 200 may draw a circle for each ground location as shown in FIG. 6 by using the shortest distance g1 that is a half of the distance between the ground locations a1 and a2. For example, if the determined shortest distance g1 is 0.1 m, the selecting module 200 may form a circle with a radius of 0.1 m for each of the five ground locations a1 to a5 and then find the region e that does not belong to any circle as shown in FIG. 6.

Meanwhile, the selecting module 200 may select the reference location as a region form.

For example, the selecting module 200 may select the reference location in a region form having a predetermined area as indicated by e in FIG. 6, instead of a point. At this time, the region selected as the reference location may be surrounded by a plurality of straight lines or curved lines.

In this case, the calculating module 300 may calculate a distance from the center point of the region to a nearest ground location as a reference distance. Here, the center point may be set in various ways such as the center of gravity.

For example, the calculating module 300 may select a center point of the region indicated by e in FIG. 6 as b in FIG. 4, and calculate a distance L from the center point b to the nearest ground location a2 as a reference distance.

Also preferably, the checking module 100 may include an input unit for receiving a ground location from a user.

For example, the checking module 100 may include a mouse, a keyboard and/or a monitor as the input unit. In this case, the user may use the input unit to input the ground locations a1 to a5.

According to this configuration of the present disclosure, the checking module 100 does not need to directly check the ground locations since the reference location may be selected using the ground locations input by the user.

Also preferably, the checking module 100 may directly check the ground locations on the circuit board. In particular, the checking module 100 may check the ground locations from a photo image obtained by photographing the circuit board. For this, the checking module 100 may include a photographing unit such as a camera for photographing the circuit board.

For example, the checking module 100 may photograph an upper portion of the circuit board equipped with the BMS as shown in FIG. 1 by the photographing unit to obtain a top image of the circuit board.

In this case, the checking module 100 may check the ground locations by identifying the ground capacitor and the connector terminals from the top image.

Alternatively, the checking module 100 may provide the photographed image to the monitor and allow the user to directly select the ground locations through the input unit.

Figure 9:
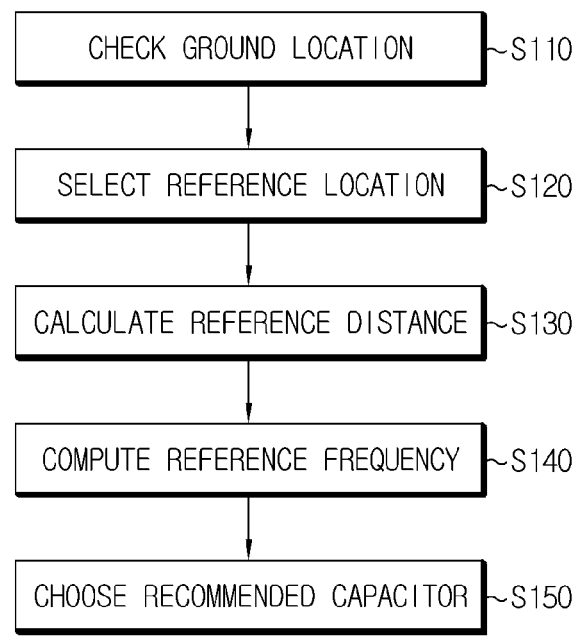
FIG. 9 is a schematic flowchart for illustrating a method for selecting a ground capacitor according to an embodiment of the present disclosure.

FIG. 9 is a schematic flowchart for illustrating a method for selecting a ground capacitor according to an embodiment of the present disclosure. For example, the method for selecting a ground capacitor as shown in FIG. 9 may be performed by the apparatus for selecting a ground capacitor according to the present disclosure as described above. That is, each step of FIG. 9 may be performed by each component included in the apparatus for selecting a ground capacitor according to the present disclosure.

As shown in FIG. 9, in the method for selecting a ground capacitor according to the present disclosure, first, a ground location may be checked on a circuit board (S110). Next, based on the ground location checked in Step S110, a reference location may be selected on the circuit board (S120). Next, a distance from the selected reference location selected in Step S120 to a nearest ground location may be calculated as a reference distance (S130). Next, a reference frequency may be computed using the reference distance calculated in Step S130 (S140). After that, based on the reference frequency computed in Step S140, a recommended capacitor may be selected (S150).

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, in this specification, the term 'module' is used, such as 'a checking module', 'a selecting module', 'a calculating module', 'a computing module' and 'a choosing module'. However, it will be apparent to those skilled in the art that this term just represents a logical configuration unit and is not intended to represent a component that must be physically separable or physically separated.

That is, each component in the present disclosure corresponds to a logical component for realizing a technical idea of the present disclosure. Thus, even though the components are integrated or separated, it should be interpreted as falling within the scope of the present disclosure as long as the function of the logical component of the present disclosure can be performed. Also, any element performing the same or similar function should be construed as being within the scope of the present disclosure irrespective of the conformity of the name.

REFERENCE SIGNS

1: chassis
10: ground capacitor
20: circuit board
30: BMS
40: bolt
50: connector terminal
100: checking module
200: selecting module
300: calculating module
400: computing module
500: choosing module
600: storing module

What is claimed is:

1. An apparatus for selecting a ground capacitor that is connected between a ground of a circuit board included in a battery pack and a vehicle chassis, the apparatus comprising:
   a checking module configured to check one or more ground locations on the circuit board;
   a selecting module configured to select a reference location on the circuit board, based on the one or more ground locations checked by the checking module;
   a calculating module configured to calculate a distance from the reference location selected by the selecting module to a nearest ground location as a reference distance;
   a computing module configured to compute a reference frequency by using the reference distance calculated by the calculating module; and
   a choosing module configured to choose a recommended capacitor, based on the reference frequency computed by the computing module.

2. The apparatus for selecting a ground capacitor according to claim 1,
   wherein the circuit board is coupled to the vehicle chassis by a bolt, and
   wherein the ground capacitor has one end connected to the bolt and the other end connected to the ground of the circuit board.

3. The apparatus for selecting a ground capacitor according to claim 1,
wherein the checking module checks locations of a connector terminal and the ground capacitor provided at the circuit board, as the one or more ground locations.

4. The apparatus for selecting a ground capacitor according to claim 1,
wherein the selecting module forms a circle around each of the one or more ground locations with the same radius and selects at least a part of a region positioned out of the formed circles and existing on the circuit board as the reference location.

5. The apparatus for selecting a ground capacitor according to claim 4,
wherein the selecting module calculates a distance from a center point of two ground locations to each ground location, selects a minimum distance that is shortest among the calculated distances, identifies a ground location pair where the selected minimum distance is longest, and sets a distance from a center point of the identified ground location pair to the identified ground location pair as the radius.

6. The apparatus for selecting a ground capacitor according to claim 1,
wherein the selecting module selects the reference location as a region, and
wherein the calculating module calculates a distance from a center point of the region to a nearest ground location as the reference distance.

7. The apparatus for selecting a ground capacitor according to claim 1,
wherein the computing module computes a wavelength at the circuit board and a wavelength in air in order by using the reference distance and computes the reference frequency according to the computed wavelength in air.

8. The apparatus for selecting a ground capacitor according to claim 1,
wherein the choosing module chooses a capacitor having a resonance frequency equal to or lower than the reference frequency as the recommended capacitor.

9. The apparatus for selecting a ground capacitor according to claim 8,
wherein the choosing module chooses a capacitor having a lowest parasitic resistance among capacitors having a resonance frequency equal to or lower than the reference frequency as the recommended capacitor.

10. The apparatus for selecting a ground capacitor according to claim 1,
wherein the checking module includes an input unit for receiving the one or more ground locations from a user.

11. The apparatus for selecting a ground capacitor according to claim 1,
wherein the checking module checks the one or more ground locations from a photo image obtained by photographing the circuit board.

12. The apparatus for selecting a ground capacitor according to claim 1, further comprising:
a storing module configured to store resonance frequency information about various kinds of capacitors.

13. A method for selecting a ground capacitor that is connected between a ground of a circuit board included in a battery pack and a vehicle chassis, the method comprising:
a checking step for checking one or more ground locations on the circuit board;
a selecting step for selecting a reference location on the circuit board, based on the one or more ground locations checked in the checking step;
a calculating step for calculating a distance from the reference location selected in the selecting step to a nearest ground location as a reference distance;
a computing step for computing a reference frequency by using the reference distance calculated in the calculating step; and
a choosing step for choosing a recommended capacitor, based on the reference frequency computed in the computing step.

14. The method for selecting a ground capacitor according to claim 13,
wherein the checking step checks locations of a connector terminal and the ground capacitor provided at the circuit board, as the one or more ground locations.

15. The method for selecting a ground capacitor according to claim 13,
wherein the selecting step forms a circle around each of the one or more ground locations with the same radius and selects at least a part of a region positioned out of the formed circles and existing on the circuit board as the reference location.

16. The method for selecting a ground capacitor according to claim 15, further comprising:
calculating a distance from a center point of two ground locations to each ground location;
selecting a minimum distance that is shortest among the calculated distances;
identifying a ground location pair where the selected minimum distance is longest; and
setting a distance from a center point of the identified ground location pair to the identified ground location pair as the radius.

17. The method for selecting a ground capacitor according to claim 13,
wherein the selecting step selects the reference location as a region, and
wherein the calculating step calculates a distance from a center point of the region to a nearest ground location as the reference distance.

18. The method for selecting a ground capacitor according to claim 13,
wherein the computing step computes a wavelength at the circuit board and a wavelength in air in order by using the reference distance and computes the reference frequency according to the computed wavelength in air.

19. The method for selecting a ground capacitor according to claim 13, wherein the choosing step chooses a capacitor having a lowest parasitic resistance among capacitors having a resonance frequency equal to or lower than the reference frequency as the recommended capacitor.

20. The method for selecting a ground capacitor according to claim 13,
the one or more ground locations are received from at least one of:
an input unit for receiving the one or more ground locations from a user, or
a photo image obtained by photographing the circuit board.

* * * * *